United States Patent [19]

Thomson

[11] Patent Number: 4,642,780
[45] Date of Patent: Feb. 10, 1987

[54] SPACE PLANNING/FACILITIES MANAGEMENT SYSTEM USING PRIORITY AND AFFINITY COLORS

[75] Inventor: Robert Thomson, Northboro, Mass.

[73] Assignee: Sigma Design, Inc., Englewood, Colo.

[21] Appl. No.: 667,644

[22] Filed: Nov. 2, 1984

[51] Int. Cl.⁴ .............................................. G06F 7/00
[52] U.S. Cl. ................................. 364/512; 364/521; 434/72
[58] Field of Search ...................... 364/512, 521, 526; 434/72; 340/701, 720, 747

[56] References Cited

U.S. PATENT DOCUMENTS 4,275,449 6/1981 Aish .................................... 364/512

Primary Examiner—Michael L. Gellner
Attorney, Agent, or Firm—Cooper, Dunham, Griffin & Moran

[57] ABSTRACT

Disclosed are a system and a method useful in fields such as architecture, space planning, interior design and corporate facility management, for efficiently designing and allocating space to the various subdivisions of an organization. Manipulation of colors is used in addition to numerical values to allow the user to determine at a glance the relative priorities of various departments and the affinities between pairs of departments at various stages of the space allocation process, and thereby speed the process and reduce the chance for errors.

3 Claims, 11 Drawing Figures

Affinity Screen

PROJECT NAME:
filename

| SIZE | NO. | DEPT. NAME | | 1 | 2 | 3 | 4 |
|------|-----|------------|---|---|---|---|---|
| 300  | 1   | PRESIDENT  | 1 |   |   |   |   |
| 1500 | 2   | ACCOUNTING | 2 |   |   |   |   |
| 3300 | 3   | SHIPPING   | 3 |   |   |   |   |
| 800  | 4   | BILLING    | 4 |   |   |   |   |

2 1 0 -1 stacking screen

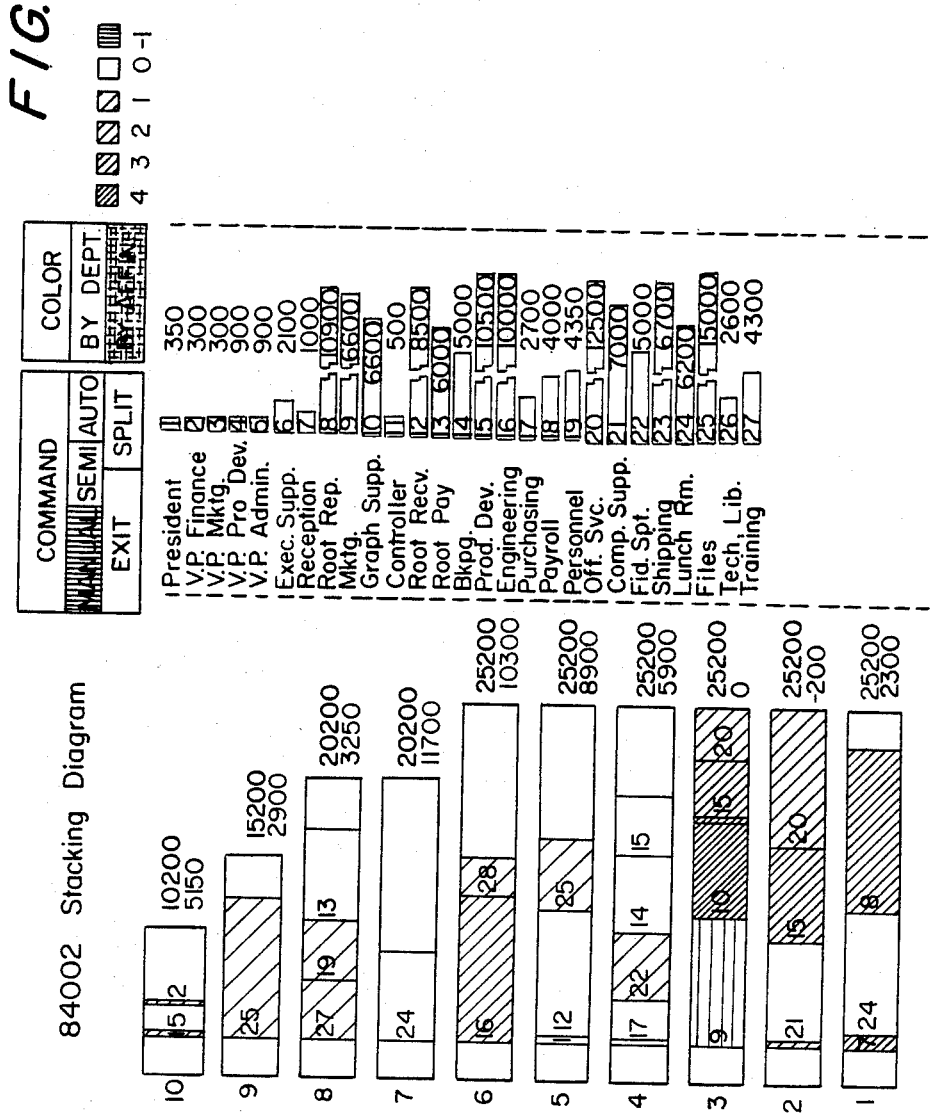

SPACE PLANNING/FACILITIES MANAGEMENT SYSTEM USING PRIORITY AND AFFINITY COLORS

BACKGROUND AND SUMMARY OF THE INVENTION

The invention is in the field of CAD systems and methods for space planning, interior design and facilities management, as used, for example, by architects, space planners, interior designers and corporate facilities managers for designing and allocating space to the various subdivisions of their clients' projects.

Systems and methods of this general type have been in use for some time. An example in the system commercially available under the trade name SIGMA III from SIGMA Design, Inc. of Englewood, Colo., the assignee of this application. It is believed that other systems of this general type are offered by Calma, a division of General Electric Company, by Computervision of Bedford, Mass., by Intergraphic of Huntsville, Ala., by CalComp, a division of Sanders Associates, and by Prime Computers. Certain aspects of systems of this general type are discussed in U.S. Pat. Nos. 3,705,410 and 4,275,449. The first patent appears to be directed to a space allocation system for goods, and the second patent appears to be directed to a modeling arrangement for a building layout.

As exemplified by the SIGMA III system identified above, systems of this type can operate by gathering answers to a series of questions to the user, to elicit information such as project data, identification of departments, of available floor space and of furniture and equipment, determination of affinities between departments (i.e., the degree of desirability or undesirability of having departments close to each other), staffing personnel priorities, etc. Typically, there is a stacking process in which the designer, with the help of the system, determines the optimum vertical arrangement of the various departments. In one example, the system displays a stack of floors on the left side of the screen while the right side of the screen displays of column of rows each identifying respective departments. The user can enter the departments on the correct floor using manual, semi-automatic or automatic modes. Once a satisfactory vertical sorting of the departments has been completed, the user can begin the so-called blocking process, in which the user fits together the departments which ended up on a given floor. As an example, in the blocking process the departments which ended up on a given floor are displayed on the right-hand side of the screen while the left side displays the floor plan, and the user can move departments to selected floor areas using manual, semi-automatic or automatic blocking commands. Following this, the designer can begin placing interior partitions and furniture on the floor plan, using the blocking plan outlined as a reference, can place furniture, can create various report, etc. Background information on the SIGMA III system identified above can be found in the following material, where is hereby incorporated by reference into this specification as though fully set forth herein: "SIGMA Design's-SIGMA III," F-M Automation Newsletter, Volume 7, No. 7, July 1984, and the Product Reference Manual of SIGMA Design, Inc. and particularly SIGMA III, SPACE PLANNING/FACILITIES MANAGEMENT MENU, Chapters 7.0-7.11, Version 5.0, July 1984.

In the prior art in which the system makes use of an indication of the affinities between departments, to the extent known those affinities are identified by numerical or letter codes. Similarly, in the known prior art systems which make use of priority ratings, the priority of a given department is indicated again in numerical or letter codes. While this can be useful, it requires the user to read those codes in order to appreciate their significance, and to keep in mind a number of such codes in case the screen displays a number of departments at the same time. Particularly in more complex situations, this can slow down the process, and can lead to errors or other difficulties.

To overcome these and other disadvantages of the known prior art in this field, this invention makes use of color blocks in a particularly efficacious manner which allows the user to tell at a glance at the screen whether the design progress up to that moment is satisfactory, and to get other important information at a glance at the screen. Also in accordance with the invention, the user can switch screen displays between different significances of color so as to get rapid and easily perceivable information about important aspects of the process as the system goes through its various stages.

In a particular and nonlimiting embodiment of the invention, after the system is provided with suitable identification of the various departments, it forms and displays, on a color screen, an affinities matrix which shows, when in a priority color mode, (i) a column identifying departments to which respective portions of a space are to be allocated and the space requirements and relative priorities of the departments, wherein priorities are indicated by respective blocks of priority colors ranging from warmer for higher priority to cooler for lower priority and (ii) the affinity between each pair of departments, indicated by respective blocks of affinity colors which are at the matrix positions corresponding to the department pairs and range from green for high affinity to paler green for lower affinity, white for neutral affinity and red for negative affinity.

For example, the left side of the screen can show a column or rows, one per department, each identifying the name of the department, its number, and its space requirements. The right side of the screen can show a matrix having a row for each department and a color for each department. The intersection of a column and a row of the matrix identifies a matrix element corresponding to that pair of departments. Of course, the diagonal at which the row and the column for the same department meet does not show affinity colors. The screen can also show the name of the project and any file name, and a row of blocks showing the chosen range of affinity colors and numerical designations for levels of affinity. The numbers identifying the respective departments in order of priority can be in blocks colored in priority colors indicative of the priorities which the respective departments have in the space allocation process (for example, highest priority can be assigned to the company president and lowest to the lunch room), and the same priority colors can be shown on the row of blocks identifying the columns of the matrix. The matrix squares can be colored in accordance with the perceived affinities between departments. For example, the matrix square for the president and the v.p. of finance can be colored green to indicate high affinity, i.e., the high desirability of having these two departments close to each other, while the matrix square for the president and the lunch room may be colored red to indicate negative affinity, i.e., the desirability of having these two departments far from each other. In case two different departments perceive their affinities differently, the matrix square for the pair above the 1,1-N,N diagonal can indicate the priority which one of the departments perceives, and the matrix square (or element) for that pair below the diagonal can show which the other department perceives. In that color scheme, called "priority" or "department" color mode, a user can get important information about priorities and affinities at a glance, without the need for reading numerical or letter codes and without the need for alphanumerical or statistical manipulations. For example, the user can get at a glance an overall idea of the distribution of priorities and affinities, an overall idea of any different views between departments as to their relative affinities, an overall idea of whether a lot or a few of the departments have expressed neutral affinities (i.e., that it makes little difference whether they are close to each other or far apart), an overall idea of the distribution of types of affinities (e.g., a need to have many departments close to each other, or a need to have many departments far from each other), as well as other general or more specific information about the priorities and affinities of the respective departments. While there is a natural limitation on the number of departments that can be shown in the affinities matrix at any one time, in terms of screen size and legibility, the matrix in fact can be much larger and only selected windows from it can be displayed at any one time, and the display scrolled through the entire matrix.

In another color scheme, referred to as an affinity color mode, the user can select or "key off" a particular department and have it colored blue to show that it has been keyed off, and the other departments on the screen automatically re-colored in their affinity colors with respect to the selected department. This happens both for the blocks for department numbers at the left side of the screen and for the department number blocks in the row on the right-hand side of the screen, over the matrix blocks. Again, this allows the user to perceive at a glance important information about affinities and priorities. The user can switch between these modes at will, and assign and reassign priorities and affinities.

After affinities and priorities are determined and perhaps manipulated with the help of the colored matrix display discussed above, a stacking diagram can be formed and displayed on the screen, replacing the affinities matrix display. The stacking diagram can show on the left side of the screen a stack of floors in the form of blocks related in size to the available floor areas, and a row of columns at the right side of the screen, each identifying a respective department, its relative priority and its space requirements. Using a manual, a semiautomatic, or an automatic mode a user can move the departments on the correct floors. For example, in the manual mode the user determines where each department should go based on his own judgement, depending on factors such as priorities, affinities and space requirements and availabilities. In a priority color mode for the stacking step, the system colors the number blocks of the department rows in the priority colors, and when a user determines that a particular block should go to a particular floor, a department allocation block is shown within the selected floor block. The size of this allocation block corresponds to the space requirements of the department, and it is in the priority color of that department. In that color mode, the user can tell at a glance the relative priorities of the departments identified at the right-hand side of the screen, what (if any) departments have been allocated to what floors, the priority of each allocated department, and the approximate relative sizes of the allocated departments and the approximate portions of their respective floors which they take.

In an affinity mode for a stacking diagram, the coloring is by affinities, and the allocation block of a selected (or keyed off) department is colored blue while the allocation blocks of other departments are colored in their respective affinity colors relative to the blue department. The affinities scale can also be displayed on the screen, together with affinity numbers. Again, the user can derive important information at a glance, e.g. information such as the relative sizes and affinities of allocated departments, and can change the diagram as needed and see the results at a glance.

Following stacking, a blocking diagram is formed and displayed on the screen. As an example, the blocking diagram shows at the left side of the screen the floor plan of a particular floor, preferably with a scaled grid, and shows on the right-hand side a column of rows each pertaining to a department. Again, the system can show the blocking diagram in a priority color mode or in an affinity color mode. In the priority (or "department") color mode the system shows the number blocks of the departments (at the right-hand side of the screen) in the respective priority colors, and shows in the same color an allocation block at the left-hand side of the screen, at a place on the floor and over a portion of the floor corresponding to the space requirements of the department. In an affinities color mode, the blocking diagram shows the allocation block of a selected (keyed off) department in blue and the affinities blocks of the other departments, in the colors indicative of the affinities of the other departments to the blue colored department, again allowing the user to derive important information at a glance at the screen, and to change the blocking diagram allocations as needed and see the results at a glance.

Accordingly, an object of the invention is to provide a system and a method utilizing color displays which make space planning/facilities management particularly convenient and efficacious. Other objects of the invention will become apparent from the detailed description below, when read in conjunction with the drawings.

BRIEF DESCRIPTION OF THE DRAWINGS

FIG. 5 illustrates a screen display showing an affinities matrix in the priority (or department) color mode.

FIG. 6 shows the affinity matrix of FIG. 5 but in the affinities color mode.

FIG. 8 shows the stacking diagram of FIG. 7 but in the affinities color mode.

DETAILED DESCRIPTION

Figure 1:
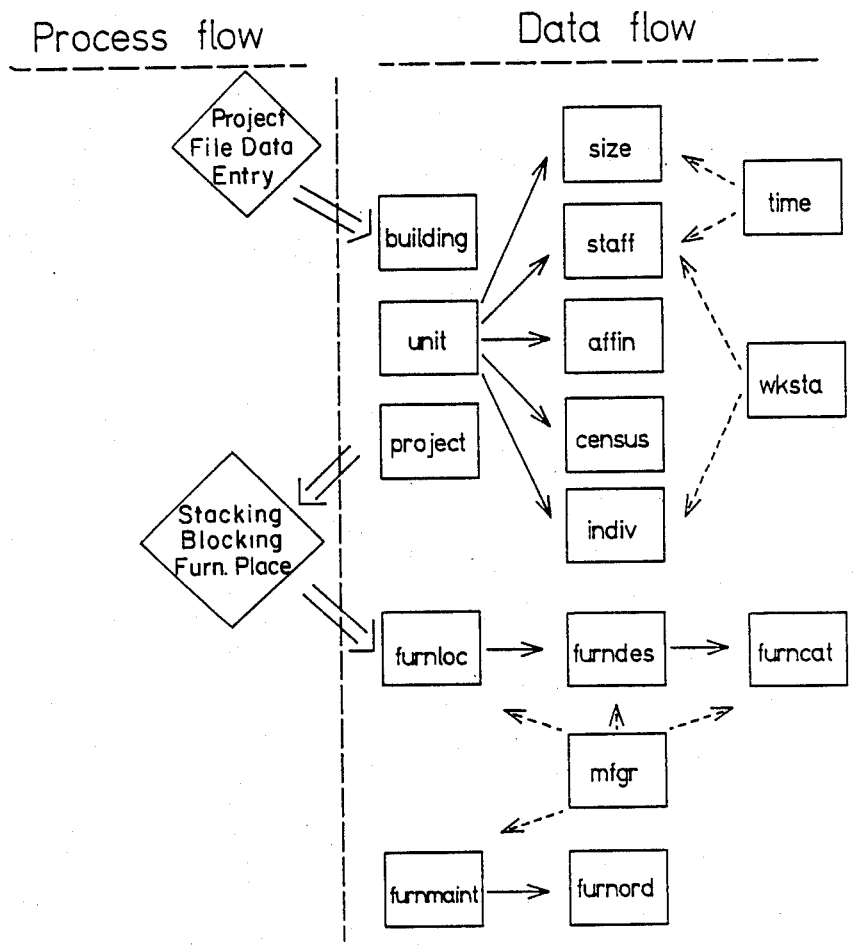
FIG. 1 illustrates the interaction between a user of an exemplary system utilizing the invention and the system to create a data base for use in the process.

In an exemplary and nonlimiting embodiment of the invention, the requirements of an organization can be estimated in the traditional fashion of surveying the organization to elicit the data required in subsequent steps of the process. This data can then be entered into the system and organized into several files, to create a data base for use in stacking, blocking, furniture placement and other steps. As indicated in FIG. 1, the data entry phase of the process flow can add information needed for data flow files for building, a unit, a project, as well as more specific information respecting size, staff, affinities, census (e.g., a phone list of personnel in the project), individual (a description of individual work stations), time (for a time period to be used), and work station (e.g., the area each staff member requires). This information can be used then in the stacking, blocking and furniture placement phase of the process flow. In the data process flow part of FIG. 1, these steps of stacking, blocking and furniture placement can lead to a structure involving furniture location (e.g., for counting furniture from actual drawing data base), furniture design (a data base for furniture design with color, material, etc.), furniture catalog (for a furniture catalog with descriptions of items), manufacturer (for information of the name of manufacturer of furniture pieces), furniture maintenance (for information respecting planned or desired maintenance of furniture items), and furniture order (for tracking furniture by purchase order).

The information collected in the survey includes information respecting the perceived priorities and affinities of the departments of an organization. In this context a "department" means any unit of an organization treated as such in the process, and can range from a large unit such as the manufacturing department of a large company to a small unit such as an individual desk or individual staff member. The priority information includes information as to the relative priority given to departments in allocating space. For example, the user of the invented system and method can choose to allocate highest priority to the president of a company, next highest priority to the vice president of finance, next highest priority to the vice president of marketing, lower priority to the bookkeeping department, lower yet priority to the office supplies department, etc. The priorities can be ranked numerically from the highest to the lowest. In terms of affinity, the information can include the perceived affinity, for example as determined by a survey, of one department to another. For example, the affinity between the president of a company and the vice president of finance may be high, in the sense that it is convenient for them to have their offices close to each other, the affinity between the company president and the shipping department may be lower, indeed negative, in the sense that it is not desirable to have these two departments close together. For example, higher positive numbers can be assigned for higher affinities, a zero can be assigned or neutral affinity, and a negative number, or progressive negative numbers, can be assigned for negative affinities. It may be that each of two departments perceives its affinity to the other department differently, in which case one affinity may be assigned as the affinity measure of the first department toward the second and another affinity may be assigned as a measure of the affinity of the second department toward the first. In addition, the data base information can include the name of the department, the perceived space requirements of the department, and the project name and other information.

Figures 2, 3:
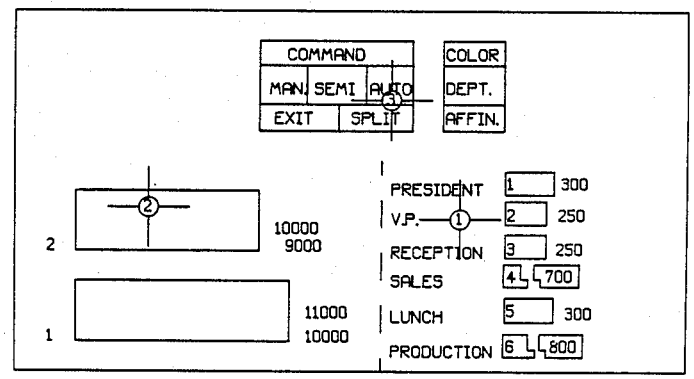
FIG. 2 illustrates in simplified form a screen display showing an affinities diagram.
FIG. 3 illustrates in simplified form a screen display showing a stacking diagram.

In accordance with the invention, this information is used to form and display on a screen an affinities matrix, such as the one illustrated in simplified form in FIG. 2 and labelled "Affinity Screen." As illustrated, the affinities matrix has at the left side of the display screen a column of rows for the respective departments. Each row identifies the size of the department (the square footage required by the department), the number of the department (in order of priority, e.g. from 1 for the highest to 4 for the lowest), and the department name. At the right-hand side of the screen display there is a square matrix having as many rows as there are departments (and as many columns). There is a matrix element (a square block) for each pair of departments. In addition, on the upper right-hand side of the screen there is a row of blocks numbered 2, 1, 0 and −1 to show the scale of possible affinities. For example, 4 can mean "absolutely must be as close as possible to each other," a −1 can mean "some separation of these departments would be beneficial" and 0 can mean it makes little difference whether the departments are close to or far from each other.

Figure 5:
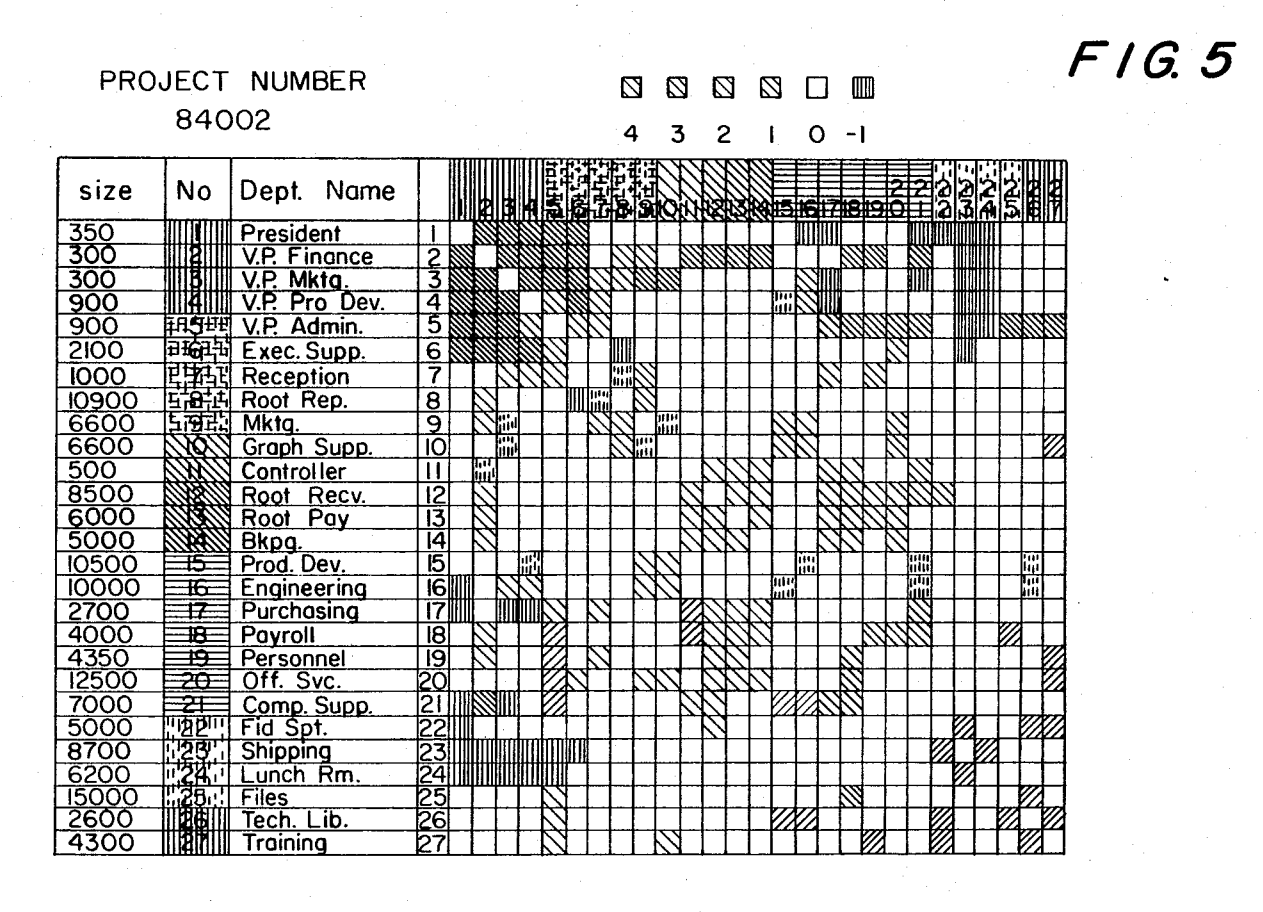
Figure 6:
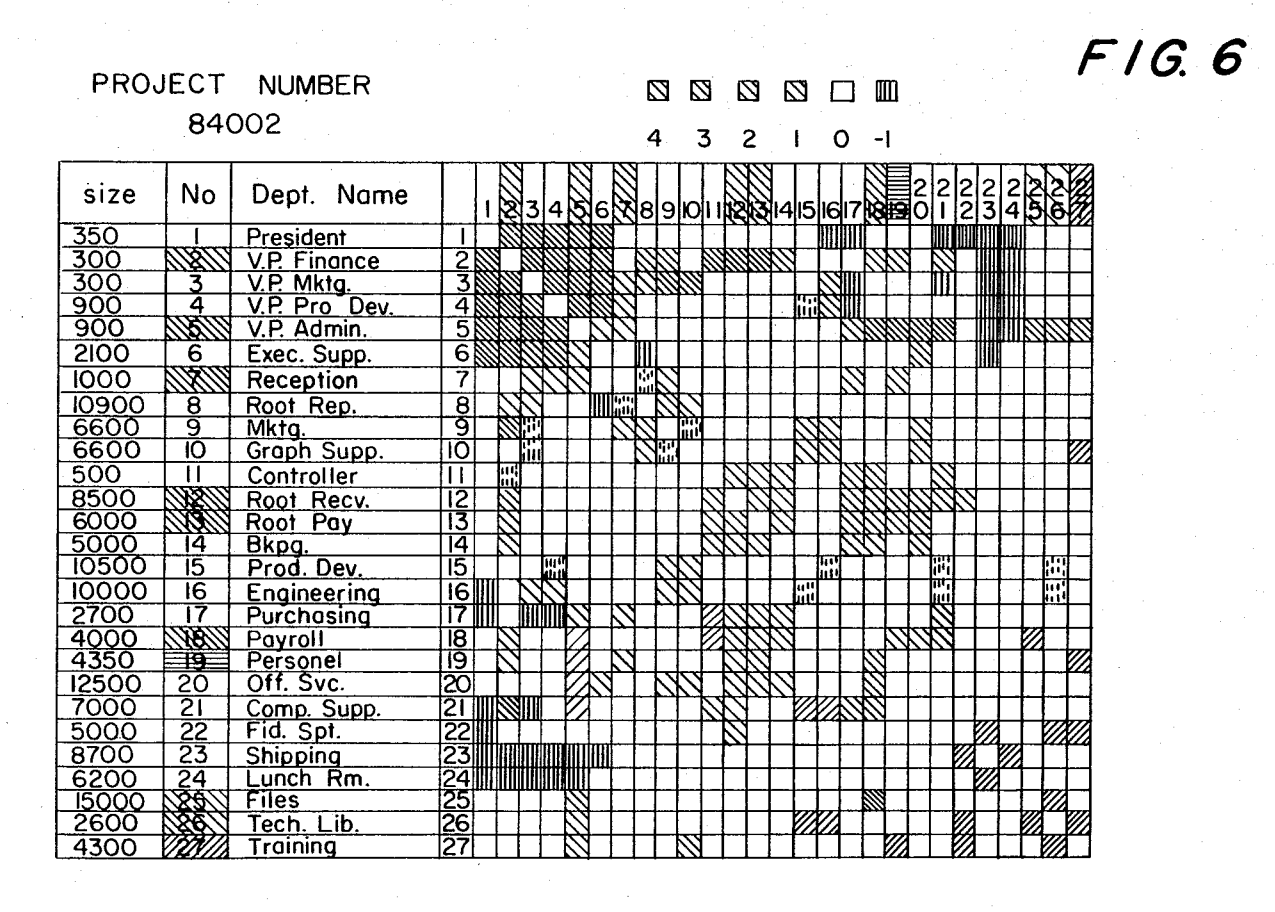

As a particularly important feature of the invention, and as further illustrated in FIGS. 5 and 6, the affinities matrix can be enhanced by using it in one of two possible color modes: in a priority (or department) color mode as shown in FIG. 5 or in an affinity color mode as shown in FIG. 6. As seen in FIG. 5, the column on the left side (for the department number) is made up of blocks, one per department, and each block contains the number of that department, in order of priority, and the entire block is colored in a color indicative of priority. In the illustrated example, the priority (or department) colors range from warmer for higher priority to cooler for lower priority. A row of blocks having the same priority numbers and same priority colors is at the top of the matrix of affinity elements. Over the affinity matrix there is a legend of six blocks labelled from +4 to −1 and containing the range of affinity colors, from green for high affinity, to paler greens for lower affinity, white for neutral affinity and red for negative affinity. The choice of six affinity colors happens to be one of the parameters for the particular example being discussed here; in fact the above-identified system from SIGMA Design, Inc. can use a range up to +9 to −9, and other ranges can be implemented in different systems embodying the principles of the invention. Each element of the matrix is a square block colored in the color of the affinity between the pair of departments represented by that matrix element. For example, in FIG. 5 matrix element 23,1 (row 23, column 1) is colored red to indicate negative affinity between the president and the shipping department. Matrix element 7,1 is colored white to indicate neutral affinity between the president and the reception department. If 2-way affinities are desired, the affinities to the upper right of the diagonal from element 1,1 to element 27,27 can show the lesser priority department affinities. For example, the affinity of department 1 to department 2 is in the lower left half of the matrix while the affinity of department 2 to department 1 is in the upper half.

A display such as that illustrated in FIG. 5 can be created by entering the survey information and then switching the system into the affinities matrix display mode, or it can be created in whole or in part by the user by placing the system into the affinities matrix display mode and then entering the needed information via a keyboard.

The affinities matrix display can be used, in the alternative, in the affinities color display mode, as illustrated in FIG. 6. The user can select a particular department, in this case department 19 (personnel) and "key off" that department and indicate to the system that he wishes to have an affinities color display. The left-hand column of department numbers then colors block 19 blue, to indicate that this is the selected or keyed off department, and colors every other department in its affinity color with respect to department 19. In this example department 20 is colored white to show that it has a neutral affinity to department 19, and department 18 is colored medium pale green, to indicate that it has affinity of level 2 to department 19. Similarly, in FIG. 6 the row of department blocks over the square matrix is similarly colored.

The coloring illustrated in FIGS. 5 and 6 allows the user to read the matrix quickly and easily by changing the color scheme between the priority and affinity color modes, and getting at a glance important information about priorities and affinities and their distribution. In addition, in case the user is in the process of entering information respecting priorities and affinities, or in the process of changing such information, this is quickly facilitated by the color schemes and by the color legend in the upper right-hand side of the display.

After the priority and affinity selections have been made, as facilitated by the coloring schemes discussed above, and any desired re-assignments of priority and affinity designations have been made, the system enters the stacking process in which the optimum vertical arrangement of the various departments is selected. As illustrated in FIG. 3, the system forms and displays a stacking diagram on the screen, showing on the left-hand side a stack of floors in the form of blocks related in size to the available floor areas and a column of rows on the right-hand side, where each row identifies a respective department, its relative priority and its space requirements. Two legends are shown at the upper part of the screen. A command legend lists manual, semi-automatic and automatic mode and a color legend has a department (priority) block and an affinities block to indicate a priority color mode and an affinity color mode. In the manual mode, the user determines to which floor each department should go. As shown in FIG. 3, there are three numbered cross-hairs, and they can be used to move a department from the right-hand menu to a selected floor, move a selected department from a selected floor back to the right-hand menu or move a department from one floor to another.

Figure 7:
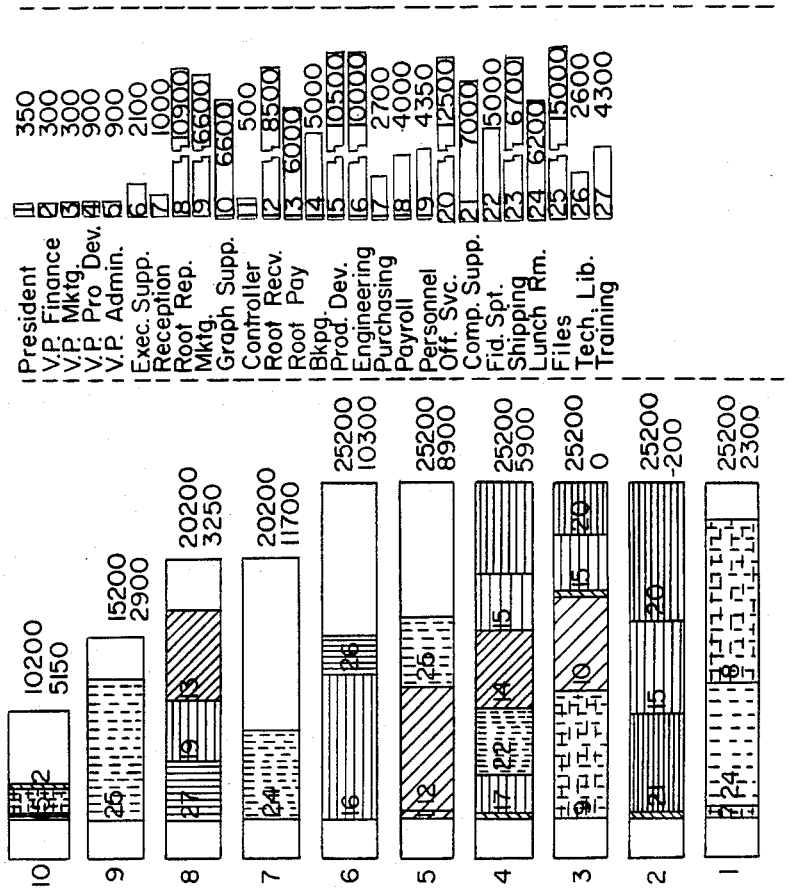
FIG. 7 shows a stacking diagram in the priority (or department) color mode.
Figure 7A:
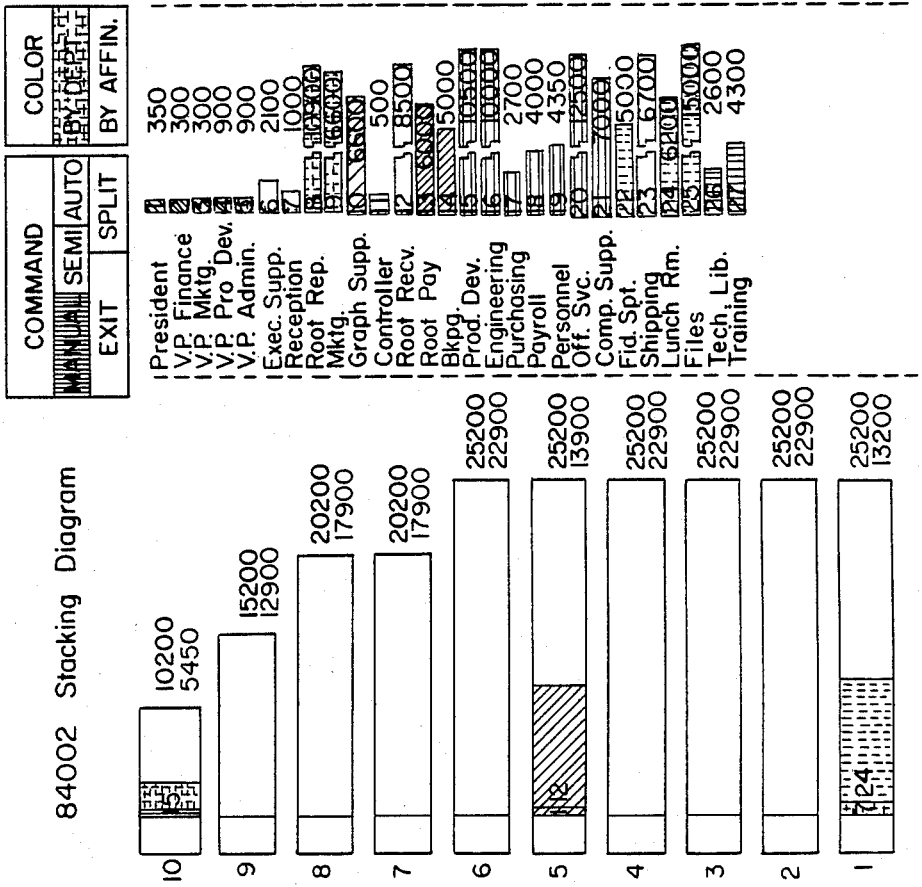
FIG. 7a shows a stacking diagram at an earlier stage of the stacking process, again in the priority color modes.

As illustrated in FIG. 7, which shows an exemplary stacking diagram, the system at this stage of the process can be operated in the department (or priority) color mode, where it shows, at the respective floor block of a selected floor, an allocation block sized in relation to the space requirements of a selected department and colored in the respective priority color of the department. For example, floor 6 shows (i) department 18 in the form of an allocation block labelled 18, colored green to indicate medium priority for the department, and (ii) department 25 in the form of an allocation block 25, colored violet to indicate low priority. In this mode, the user can tell at a glance the relative priorities of the departments which have been assigned to the floors and the distribution of departments by priority. The column of department numbers on the right-hand side of the diagram no longer has any colored blocks because all departments have been moved from the right-hand side menu to the respective floors. In the process of allocating (moving floors from the menu column on the right to the chosen floors on the left), those departments which have not yet been moved retain their colored priority number blocks, as illustrated in FIG. 7a. In the priority column mode illustrated in FIGS. 7 and 7a the legend block color has its portion labelled by department highlighted to indicate that priority colors are used in this display.

FIG. 8 illustrates an exemplary stacking diagram used in the affinity color mode, as illustrated by the highlighted "affinity" box of the color legend at the upper right-hand side of the screen. In this mode, the affinity color range is displayed at the upper right-hand side of the screen. Here, the allocation block for a selected (or keyed off) department is colored blue on the left-hand side (department 9 on the third floor) and all other departments are colored in their affinity colors relative to department 9, thus allowing a user to perceive at a glance important information respecting the affinities and distribution of departments and to make changes by switching back and forth between the two color modes for the stacking diagram phase of the process.

Figure 4:
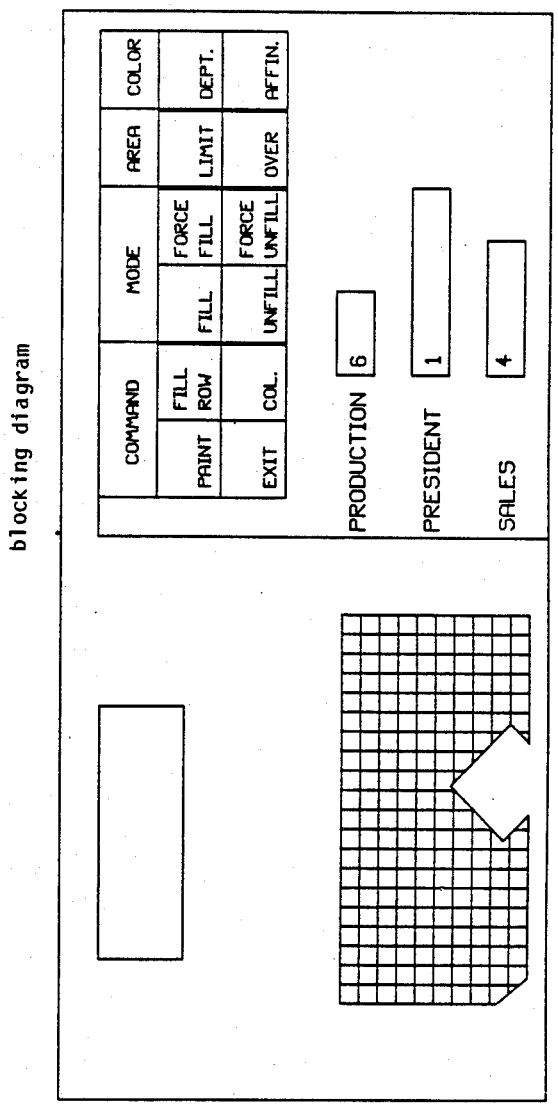
FIG. 4 illustrates in simplified form a screen display showing a blocking diagram.

After stacking is completed, the system forms and displays on the screen a blocking diagram showing a selected floor as a block sized and shaped in accordance with the floor area, and a column of rows each identifying a respective department, its relative priority and its space requirements. Referring to the simplified blocking diagram shown in FIG. 4, the left hand of the screen has a floor block, preferably with a planning grid on a selected scale, and the right-hand side of the screen shows a row for each department which ended up on that floor in the stacking process. At the upper right hand there is a legend block for items such as commands, modes, area and for color scheme (which can be either a priority color scheme or an affinities color scheme, as selected by the user). The system prompts the user for the size of the planning grid he wishes to use, and provides manual, semi-automatic and automatic blocking commands, similar to those functions in the stacking process. When the user initiates the fill command, the department he has identified begins to fill up squares in the planning grid. The unfill command does the opposite. As a department is "unfilled" or erased from the floor plan, its area is returned to the departments file and can be placed at another time. Force fill and force unfill are similar to the fill and unfill commands, but in this mode the department being placed or unplaced has precedence over the other departments and will bump (or erase) any previously placed departments. The limit area and overfill commands determine if the placement process stops when the square footage of that department has been placed on the floor plan or whether the system continues to fill in the grid squares between two bound areas on the floor plan, regardless of the department's size. The user chooses the command that is appropriate to the task he wishes to accomplish, and continues until a satisfactory blocking plan has been developed. At any point in the process he can repaint the departments in their affinity colors or in their priority colors to assist him in deciding which areas belong adjacent to each other.

Figure 9:
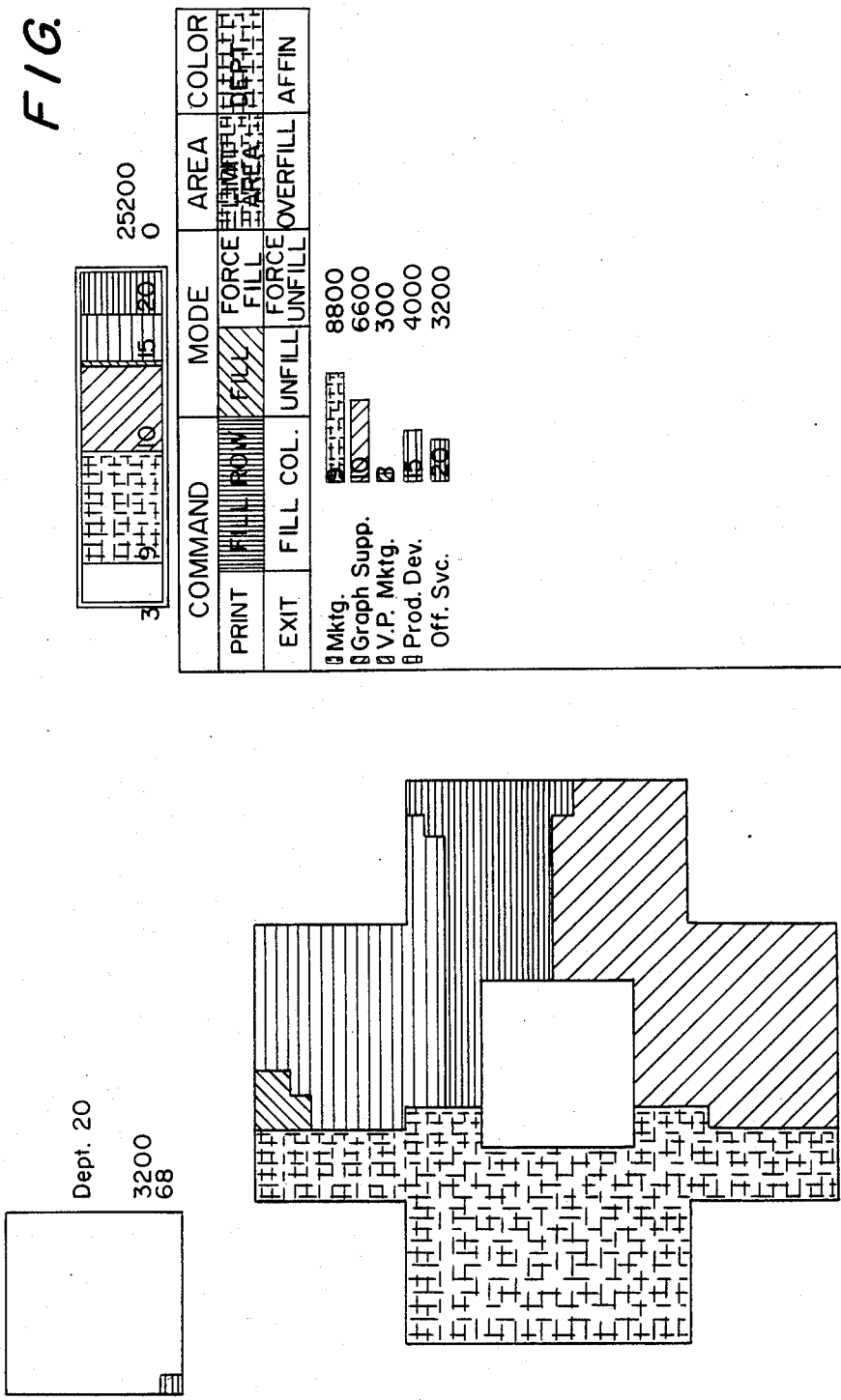
FIG. 9 shows a blocking diagram in the priority (or department) color mode.

FIG. 9 illustrates blocking in the department (priority) color mode. The right-hand side menu shows the departments by row, with the department number blocks colored in the priority colors, in color blocks whose size corresponds to the required square footage of the respective departments. The left-hand floor plan shows how the departments are fitted with respect to each other, and the color scale at the upper right-hand side of the screen shows the priority color range, and color blocks which contain the respective department numbers and have sizes corresponding to the required floor areas of the respective departments.

Figure 10:
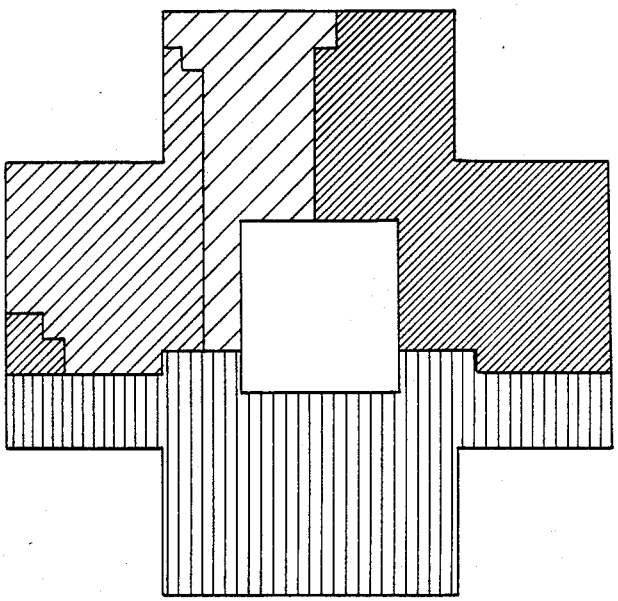
FIG. 10 shows the blocking diagram of FIG. 9 but in the affinities color mode.

FIG. 10 illustrates a blocking diagram in the affinity color mode. The color scale at the upper right-hand side is now the affinities color scale, the department blocks in the menu are colored in the affinities colors, with the selected department (marketing) colored blue and the others colored in the affinity colors with respect to the marketing department, and the floor block at the left side of the screen shows the marketing department in blue and the other departments in their affinity colors relative to the marketing department. By selectively using the color scheme of FIG. 9 and the color scheme of FIG. 10, and switching between the two, the user can derive at a glance important information assisting him in proper placement of departments on the floor and in making changes. The blocking diagram process can be repeated for each floor of interest.

The priority and affinity color manipulations of the invented system and process can be implemented as an improvement to a known CAD system and process, such as the one available commercially from SIGMA Design, Inc. To this end, a color graphics system of suitable size and configuration is programmed, using known programming techniques, to automatically assign (i) a respective priority color to the numerical or alphanumerical priority which the system user assigns to a department and (ii) a respective affinity color to the numerical or alphanumerical affinities which the user assigns. Then, in accordance with the invention, where a prior art system would display only an alphanumeric designation, a system operating accordance with the invention would display in addition to, or in place of, such alphanumeric designation, a color block, and thereby facilitate and enhance the user's interaction with the system. Once the color designations are incorporated in the department descriptions, and in the descriptions of affinities between departments, they follow the display of appropriate priority and affinity alphanumerical designations, provided a suitable color display system is used in accordance with the invention. Accordingly, because the affinity and priority designations in numerical form are known from the prior SIGMA Design, Inc. system and process, and because it is believed that a person skilled in the art can, without undue experimentation, implement the color manipulation scheme discussed above in any desired environment of specific hardware and operating system and program language, and for the sake of keeping this specification not only complete but also concise, no specific program listing is included.

In conclusion, an important aspect of the invention is the translation of alphanumerical to color information, and the addition of this color information to the alphanumerical displays, or the substitution of the color information for alphanumerical displays, to enhance understanding of the numerical information and to facilitate and speed up the user interaction with the system. It is believed that the use of color information in accordance with the invention is unique in this technology, and is an important enhancement to the usefulness of CAD systems and processes of the type discussed in detail above.

Numerous variations of the color display and manipulation modes discussed above are possible within the scope of the invention, which is defined by the appended claims.

I claim:

1. A computer implemented method comprising the steps of:

forming and displaying on a color screen an affinity matrix, and operating in a priority color mode to cause the screen to show (i) a column of rows each identifying a respective department to which a portion of a multi-story building is to be allocated and the space requirements and relative priority of the department, wherein the priority is indicated by a block of a priority color, and the priority colors range from warmer for higher priority to cooler for lower priority, and (ii) a rectangular matrix of affinity elements, wherein each element indicates the affinity between two respective departments, and the affinity level of each element is indicated by a block of an affinity color which is at the matrix position of the element and wherein the affinity colors range from green for high affinity to paler greens for lower affinity, white for neutral affinity and red for negative affinity;

selecting a department and selectively operating in an affinity color mode to cause the column block for that department to change to blue and the column blocks for the other departments to change to the respective affinity colors of the other departments relative to the selected department, to thereby facilitate determining at a glance the respective degrees of affinity of the other departments to the selected department, and selectively switching between the priority and affinity color display modes for the affinity matrix display and selectively assigning and reassigning priority and affinity colors to selected departments;

forming and displaying a stacking diagram on the screen, said stacking diagram showing a stack of floors in the form of blocks related in size to the available floor areas and a column of rows each identifying a respective department, its relative priority and its space requirements, and selectively operating in a priority color mode to cause the stacking diagram to show, at the respective floor block of a selected floor, an allocation block sized in relation to the space requirements of a selected department and colored in the respective priority color of the department, and an affinity color mode to cause the allocation block for that department to be colored blue and any other allocation blocks of other departments to be shown in their respective affinity colors relative to the department with the blue allocation color, to thereby facilitate the determination at a glance of the affinities between and the relative sizes of departments allocated to the stack of floors, and switching between the priority and affinity color modes for the stacking diagram and selectively creating and moving allocation blocks; and forming and displaying on the screen a blocking diagram showing a selected floor as a block sized and shaped in accordance with the floor area thereof and a column of rows each identifying a respective department, its relative priority and its space requirements, and selectively operating in a priority color mode to cause the blocking diagram to show, at the floor block, a department allocation block sized in relation to the space requirements of a selected department and colored in the respective priority color of the department, and in an affinity color mode to cause the allocation block for that department to be colored blue and any other allocation blocks of other departments to be shown in their respective affinity colors relative to the department with the blue allocation color, to thereby facilitate the determination at a glance of the affinities between and relative sizes of departments allocated to the floor block.

2. A computer implemented method comprising the steps of:

forming and displaying on a color screen an affinity matrix of elements, wherein each element indicates the affinity between two respective departments of a group of departments to which respective areas are to be allocated in a multistory building, and the affinity level of each element is indicated by a block in a respective affinity color which is at the matrix position of the element, and the range of affinity colors corresponds to the range of affinity levels;

forming and displaying a stacking diagram on the screen, showing floor blocks for the respective floors and department blocks for the respective departments, wherein the blocks for departments are in respective priority colors indicative of the relative priority of the departments, and selectively operating the stacking diagram in a priority color mode to cause the stacking diagram to show, at the respective floor block of a selected floor, an allocation block which is indicative of the allocation of a selected department to that floor and is in the respective priority color of the department, and an affinity color mode to cause the allocation block for that department to change to a specific color and any other allocation blocks of other departments to be shown in their respective affinity colors relative to the department changed to the specific color, to thereby facilitate the determination at a glance of the affinities between and the relative sizes of departments allocated to the stack of floors, and switching between the priority and affinity color modes for the stacking diagram and selectively creating and moving allocation blocks; and forming and displaying on the screen a blocking diagram showing a selected floor as a block, and selectively operating the blocking diagram in a priority color mode to cause the blocking diagram to show, at the floor block, a department allocation block which is at a position related to the space requirements of a selected department and is colored in the respective priority color of the department, and in an affinity color mode to cause the allocation block for that department to change to a chosen color and any other allocation blocks of other departments to be shown in their respective affinity colors relative to the department changed to the chosen color, to thereby facilitate the determination at a glance of the affinities between and relative sizes of departments allocated to the floor block.

3. A method of operating a space allocation color graphics system comprising the steps of:

causing the graphics system to associate a selected priority to each department of a group of departments which have respective space requirements and are to be assigned space in a specified multistory building and to associate a selected affinity to each pair of said departments;

programming the graphics system to associate a respective priority color with each respective priority level and to associate a respective affinity color with each respective level of affinity;

operating the system in an interactive, affinity matrix mode to show on the screen an affinity matrix in which the matrix elements correspond to respective pairs of departments and are displayed in the respective affinity colors and to allow a user to change affinity levels;

operating the system in an interactive, stacking mode to show on the screen a stacking diagram illustrative of the floors and to allow a user to show, on the screen, representation of selected departments on selected floors, either in a priority color mode, in which the departments are shown in their respective priority colors, or in an affinity color mode, in which one department is shown in a specified color and the others are shown in their affinity colors relative thereto; and operating the system in an interactive, blocking mode to show on the screen a blocking diagram illustrative of a selected floor and to allow a user to show, on the screen, representation of selected departments on selected portions of the floor, either in a priority color mode, in which the departments are shown in their respective priority colors, or in an affinity color mode, in which one department is shown in a specified color and the others are shown in their affinity colors relative thereto.

* * * * *